(12) United States Patent
Gopalan

(10) Patent No.: US 8,723,553 B1
(45) Date of Patent: May 13, 2014

(54) SYSTEMS AND METHODS FOR PERFORMING FREQUENCY OFFSET ESTIMATION

(71) Applicant: QUALCOMM Incorporated, San Diego, CA (US)

(72) Inventor: RaviKiran Gopalan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/773,784

(22) Filed: Feb. 22, 2013

(51) Int. Cl.
*G01R 23/02* (2006.01)
*H04L 27/26* (2006.01)

(52) U.S. Cl.
CPC ................................ *H04L 27/266* (2013.01)
USPC ............................................. 327/47; 375/344

(58) Field of Classification Search
CPC ............... H04L 27/2675; H04L 2027/0065; H04L 2027/0026; H04L 2027/0046; H04L 27/266
USPC ................... 327/39, 47, 336, 339, 355, 361; 375/344
See application file for complete search history.

(56) References Cited

U.S. PATENT DOCUMENTS

| | | | |
|---|---|---|---|
| 2002/0123311 A1* | 9/2002 | Nagayasu | 455/70 |
| 2006/0023823 A1* | 2/2006 | Sun et al. | 375/362 |
| 2008/0260076 A1* | 10/2008 | Lai et al. | 375/344 |
| 2009/0245428 A1 | 10/2009 | Yang et al. | |
| 2010/0220819 A1 | 9/2010 | Li et al. | |
| 2011/0051855 A1 | 3/2011 | Shibata | |
| 2011/0216865 A1 | 9/2011 | Qi et al. | |
| 2012/0114022 A1 | 5/2012 | Lever et al. | |

* cited by examiner

*Primary Examiner* — Lincoln Donovan
*Assistant Examiner* — Jung H Kim
(74) *Attorney, Agent, or Firm* — Austin Rapp & Hardman

(57) ABSTRACT

A method for determining an effective frequency offset by circuitry is described. The method includes determining a first frequency offset average over a first half of a syncword. The method also includes determining a second frequency offset average over the entire syncword. The method further includes determining a third frequency offset average over a second half of the syncword. The method additionally includes determining an effective frequency offset at an end of the syncword based on the first frequency offset average, the second frequency offset average and the third frequency offset average.

32 Claims, 11 Drawing Sheets

US 8,723,553 B1

SYSTEMS AND METHODS FOR PERFORMING FREQUENCY OFFSET ESTIMATION

TECHNICAL FIELD

The present disclosure relates generally to signal processing. More specifically, the present disclosure relates to systems and methods for performing frequency offset estimation.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. For example, electronic devices that perform functions faster, more efficiently or with higher quality are often sought after.

As the use of electronic devices has proliferated, their size, implementation cost, power efficiency and features have taken increasing importance. For example, consumers may prefer to use electronic devices that offer better power efficiency (e.g., battery performance), smaller size, lower cost and additional features.

However, adding more features often comes as a tradeoff to larger size, reduced power efficiency and/or additional cost. For instance, additional features may require additional die area and/or may consume more power. Accordingly, features that are designed in a way that requires reduced space, better power efficiency and/or lower implementation cost may be beneficial.

SUMMARY

A method for determining an effective frequency offset by circuitry is described. The method includes determining a first frequency offset average over a first half of a syncword. The method also includes determining a second frequency offset average over the entire syncword. The method additionally includes determining a third frequency offset average over a second half of the syncword. The method further includes determining an effective frequency offset at an end of the syncword based on the first frequency offset average, the second frequency offset average and the third frequency offset average.

The effective frequency offset may include a constant frequency offset component and a linearly varying frequency drift component. The effective frequency offset may be equal to the second frequency offset average plus the third frequency offset average minus the first frequency offset average.

Determining the first frequency offset average over the first half of the syncword may include averaging instantaneous frequency offsets over the first half of the syncword. Determining the second frequency offset average over the entire syncword may include averaging instantaneous frequency offsets over the entire syncword. Determining the third frequency offset average over the second half of the syncword may include averaging instantaneous frequency offsets over the second half of the syncword.

The method may additionally include providing the effective frequency offset to an electronic device. The method may be performed by an acquisition block.

Circuitry for determining an effective frequency offset is also described. The circuitry includes averaging circuitry that determines a first frequency offset average over a first half of a syncword, determines a second frequency offset average over the entire syncword, and determines a third frequency offset average over a second half of the syncword. The circuitry also includes effective frequency offset determination circuitry coupled to the averaging circuitry, wherein the effective frequency offset determination circuitry determines an effective frequency offset at an end of the syncword based on the first frequency offset average, the second frequency offset average and the third frequency offset average.

A computer-program product for determining an effective frequency offset is also described. The computer-program product includes a non-transitory tangible computer-readable medium having instructions thereon. The instructions include code for causing circuitry to determine a first frequency offset average over a first half of a syncword. The instructions also include code for causing the circuitry to determine a second frequency offset average over the entire syncword. The instructions additionally include code for causing the circuitry to determine a third frequency offset average over a second half of the syncword. The instructions further include code for causing the circuitry to determine an effective frequency offset at an end of the syncword based on the first frequency offset average, the second frequency offset average and the third frequency offset average.

An apparatus for determining an effective frequency offset is also described. The apparatus includes means for determining a first frequency offset average over a first half of a syncword. The apparatus also includes means for determining a second frequency offset average over the entire syncword. The apparatus additionally includes means for determining a third frequency offset average over a second half of the syncword. The apparatus further includes means for determining an effective frequency offset at an end of the syncword based on the first frequency offset average, the second frequency offset average and the third frequency offset average.

DETAILED DESCRIPTION

Figure 1:
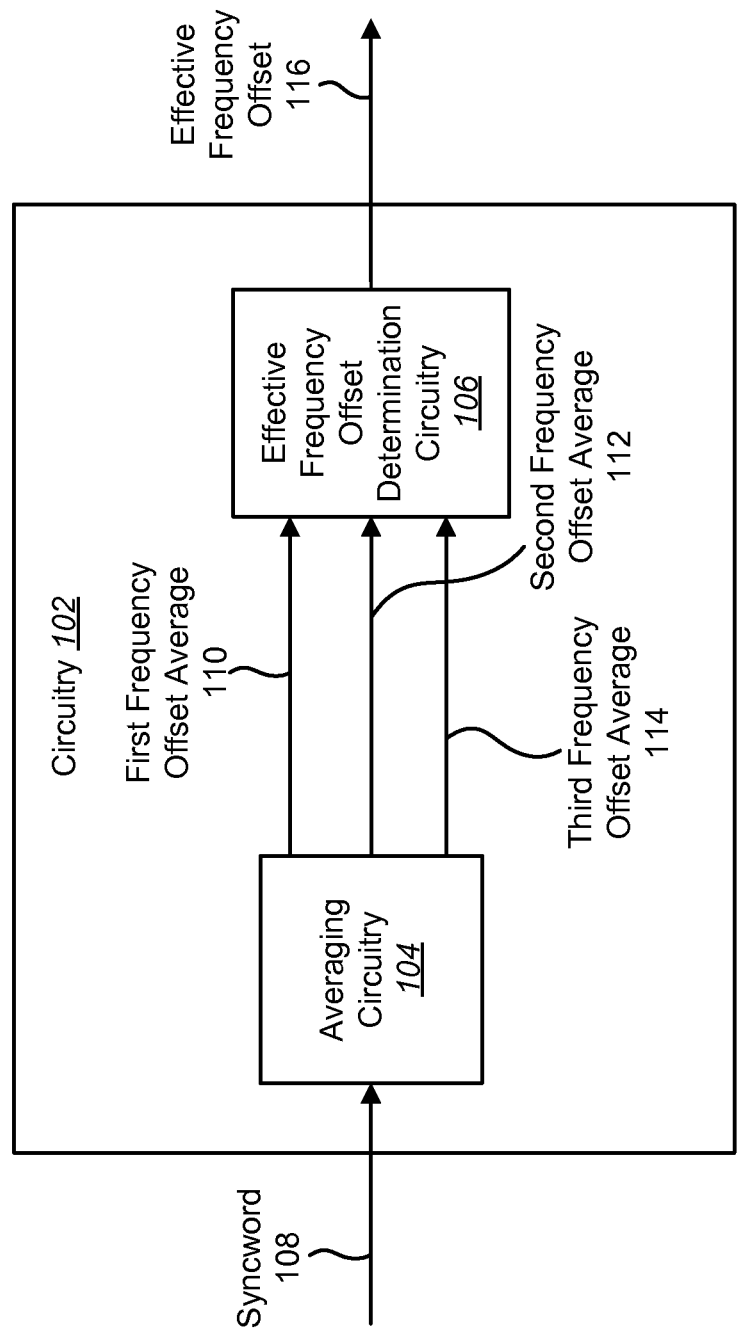
FIG. 1 is a block diagram illustrating one configuration of circuitry for performing frequency offset estimation.

The systems and methods disclosed herein may be applied to a variety of electronic devices. Examples of electronic devices include circuitry, integrated circuits, televisions, monitors, projectors, cellular phones, smartphones, voice recorders, video cameras (e.g., camcorders), audio players (e.g., Moving Picture Experts Group-1 (MPEG-1) or MPEG-2 Audio Layer 3 (MP3) players), video players, audio recorders, desktop computers, laptop computers, personal digital assistants (PDAs), gaming systems, etc. One kind of electronic device is a communication device, which may communicate with another device. Examples of communication devices include telephones, laptop computers, desktop computers, cellular phones, smartphones, wireless or wired modems, e-readers, tablet devices, gaming systems, cellular telephone base stations or nodes, access points, wireless gateways and wireless routers, etc.

Electronic devices often require an estimate of a frequency offset between signals to operate as desired. Typical acquisition schemes tend to provide a poor estimate of effective frequency offset. For example, in a receiver, the acquisition block may first detect the presence of a syncword. This may form the first step in the receive process. The acquisition block, after searching for a syncword and locking onto it, may determine an effective frequency offset.

The effective frequency offset may be a combination of two frequency imperfections. One type of frequency imperfection is frequency offset, which may be modeled as a constant offset component in the center frequency. The other frequency imperfection is frequency drift, which may be modeled as a frequency offset component that linearly increases with time.

The effective frequency offset may allow a frequency tracking loop to compensate for frequency offset. The frequency tracking loop needs to be initialized with the effective frequency offset seen at the end of the syncword to operate as desired. Therefore, an acquisition block should determine the effective frequency offset at the end of the syncword. However, known frequency estimation techniques average the instantaneous frequency offsets over the entire syncword period. These techniques determine the average of the linearly increasing frequency drift component. In other words, known frequency estimation techniques estimate the effective frequency offset as illustrated in Equation (1).

$$f^* = f_{offset} + \frac{1}{2} \cdot L_{syncword} \cdot f_{drift} \quad (1)$$

In Equation (1) $f_{offset}$ is the constant frequency offset component, $L_{syncword}$ is the syncword period and $f_{drift}$ is the linearly varying frequency drift component. However, a more accurate estimation of the effective frequency offset at the end of the syncword is based on Equation (2).

$$f = f_{offset} + L_{syncword} \cdot f_{drift} \quad (2)$$

According to the systems and methods described herein, an estimation for the effective frequency offset at the end of the syncword (e.g., at the end of the syncword period) may be determined based on the average frequency offset at three selected points in time. For example, a linear combination of the three frequency offset averages produces a final estimate which accurately corresponds to the final frequency offset at the end of the estimation period (e.g., the syncword period), without explicitly estimating the frequency drift component.

FIG. 1 is a block diagram illustrating one configuration of circuitry 102 for performing frequency offset estimation. The circuitry 102 may be implemented with a plurality of circuit components. For example, the circuitry 102 may include one or more resistors, capacitors, inductors, transistors, logic gates, registers, memory cells, processing blocks and/or switches, etc. For instance, the circuitry 102 may be implemented as an integrated circuit, an application-specific integrated circuit (ASIC), field-programmable gate array (FPGA), etc.

The circuitry 102 includes averaging circuitry 104 and effective frequency offset determination circuitry 106. The averaging circuitry 104 is coupled to the effective frequency offset determination circuitry 106. As used herein, the term "couple" and variations thereof may denote a direct or indirect connection. For example, a first component that is coupled to a second component may be directly connected to the second component or indirectly connected to the second component through another component.

The averaging circuitry 104 may receive a syncword 108. In some configurations, the syncword 108 is included in a packet that is transmitted in a bit stream (e.g., a modulated signal). The syncword 108 may also be referred to as a sync word, a sync character, a synchronous character, an access code or a preamble. The syncword 108 may be used to synchronize a transmission. The syncword 108 may be a unique code that includes a sequence of bits. In some configurations, the circuitry 102 may be included in a receiver (e.g., a wireless receiver), which may receive a data transmission from a transmitter.

The circuitry 102 may identify the syncword 108 in the packet. The circuitry 102 may use the syncword 108 to determine frequency information and timing information of the data transmission. For example, the circuitry 102 may determine an effective frequency offset 116 based on the syncword 108.

The effective frequency offset 116 may be an estimation of the total frequency offset for the transmission (at the end of the syncword, for instance). For example, the effective frequency offset 116 may be an estimate of the difference between a frequency (e.g., a frequency of a transmission sent from a transmitter) and the frequency of the transmission when received at the circuitry 102. In one configuration, the transmission may be transmitted wirelessly using radio waves. For example, the transmitter and receiver may perform a transmission using one or more wireless standards (e.g., IEEE 802.11, Bluetooth, etc.). Therefore, the effective frequency offset 116 may be an estimate of the difference between a carrier center frequency (e.g., the center frequency of a transmitted radio frequency (RF) signal) and a frequency at the end of the syncword 108 (e.g., the frequency of a received RF signal at the end of the syncword 108).

The effective frequency offset 116 may be modeled with two components. One component is a constant frequency offset component that may not vary over the syncword 108 period. This constant frequency offset component may be referred to as the frequency offset ($f_{offset}$). The frequency offset represents the offset from the center frequency. Another component is a frequency drift component that may vary (e.g., increase) linearly with time. This linearly increasing component may be referred to as the frequency drift ($f_{drift}$). Therefore, the effective frequency offset 116 may be modeled with the combination of the frequency offset and the frequency drift at the end of the syncword 108 period.

The circuitry 102 may include averaging circuitry 104 to determine frequency offset averages 110, 112, 114 of different portions of the syncword 108. In one configuration, the circuitry 102 may detect a syncword 108. Upon detecting the syncword 108, the circuitry 102 may obtain instantaneous frequency offsets during the syncword 108 period. The averaging circuitry 104 may determine a first frequency offset average 110, a second frequency offset average 112 and a third frequency offset average 114 based on the instantaneous frequency offsets.

The averaging circuitry 104 may determine a first frequency offset average 110 over a first half of the syncword 108. For example, the averaging circuitry 104 may determine the first frequency offset average 110 by taking the average of the instantaneous frequency offsets over the first half of the syncword 108 period.

The averaging circuitry 104 may determine a second frequency offset average 112 over the entire syncword 108. For example, the averaging circuitry 104 may determine the second frequency offset average 112 by taking the average of the instantaneous frequency offsets over the entire syncword 108 period.

The averaging circuitry 104 may determine a third frequency offset average 114 over a second half of the syncword 108. For example, the averaging circuitry 104 may determine the third frequency offset average 114 by taking the average of the instantaneous frequency offsets over the second half of the syncword 108 period.

The circuitry 102 may include effective frequency offset determination circuitry 106. The effective frequency offset determination circuitry 106 may receive the frequency offset averages 110, 112, 114 from the averaging circuitry 104. It should be noted that the averaging circuitry 104 and the effective frequency offset determination circuitry 106 may be coupled together with one or more couplings. For example, all of the frequency offset averages 110, 112, 114 may be provided on a single coupling (e.g., a serial bus) in some configurations. In other configurations, one or more of the frequency offset averages may be provided on separate couplings. Accordingly, even though FIG. 1 conceptually depicts each of the frequency offset averages 110, 112, 114 as being provided separately to the effective frequency offset determination circuitry 106, one or more of the frequency offset averages 110, 112, 114 may be provided via the same or different couplings.

The effective frequency offset determination circuitry 106 may determine the effective frequency offset 116 at the end of the syncword 108 based on the received frequency offset averages 110, 112, 114. For example, the effective frequency offset determination circuitry 106 may determine the effective frequency offset 116 by adding the third frequency offset average 114 to the second frequency offset average 112 and subtracting the first frequency offset average 110. In some configurations, the effective frequency offset 116 may be provided to an electronic device. For example, the effective frequency offset 116 may be provided to one or more blocks and/or modules in a receive chain of an electronic device (e.g., wireless communication device). For instance, the circuitry 102 may be part of the receive chain. The effective frequency offset 116 may be utilized for frequency offset tracking.

Figure 2:
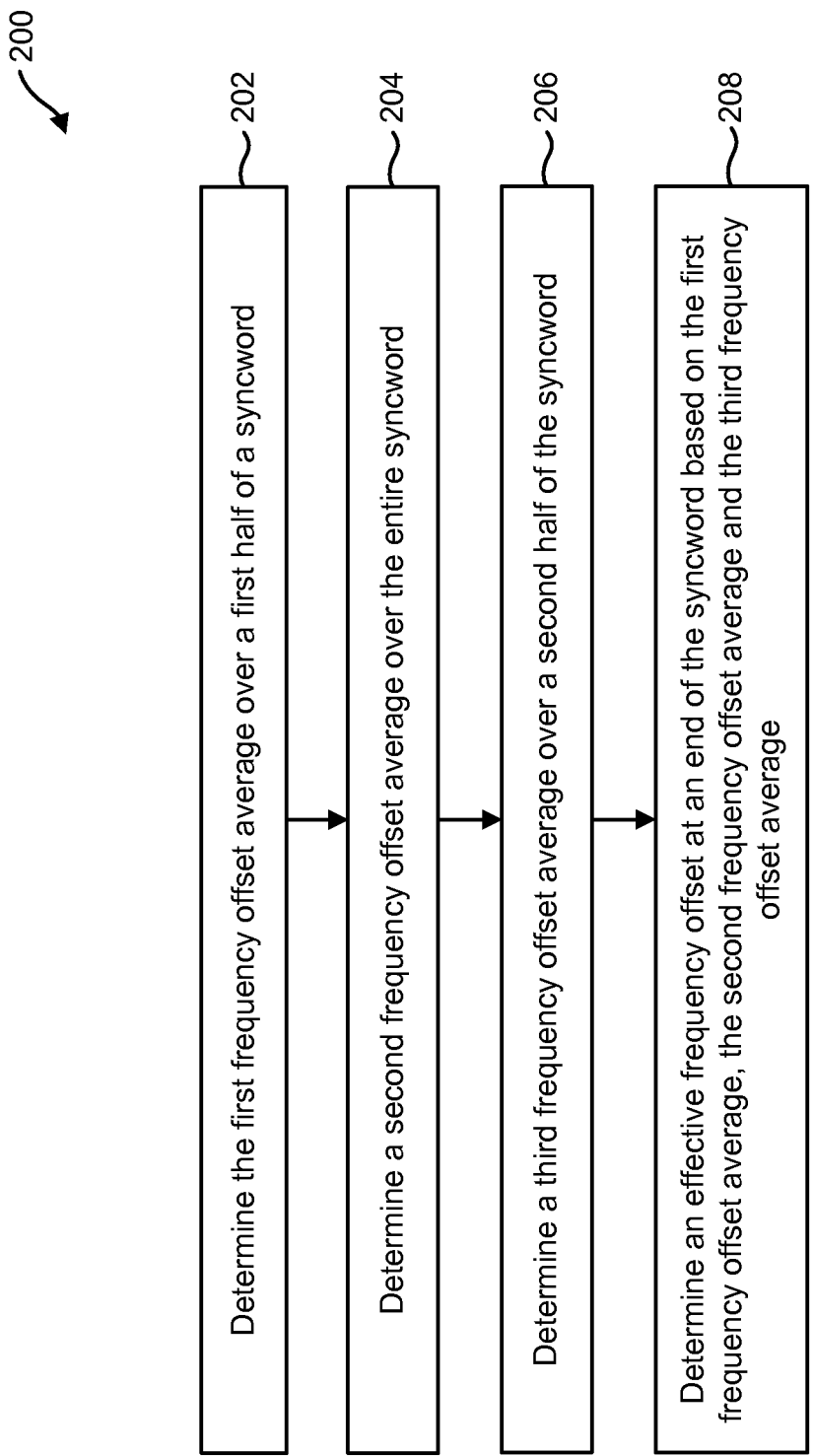
FIG. 2 is a flow diagram illustrating one configuration of a method for determining an effective frequency offset.

FIG. 2 is a flow diagram illustrating one configuration of a method 200 for determining an effective frequency offset 116. In one configuration, the method 200 may be performed by circuitry 102. The circuitry 102 may receive a syncword 108. Upon receiving the syncword 108, the circuitry 102 may determine instantaneous frequency offsets during the syncword 108 period.

The circuitry 102 may determine 202 a first frequency offset average 110 over a first half of the syncword 108. The circuitry 102 may determine 202 the first frequency offset average 110 by taking the average of the instantaneous frequency offsets over the first half of the syncword 108 period.

The circuitry 102 may determine 204 a second frequency offset average 112 over the entire syncword 108. For example, the circuitry 102 may determine 204 the second frequency offset average 112 by taking the average of the instantaneous frequency offsets over the entire syncword 108 period.

The circuitry 102 may determine 206 a third frequency offset average 114 over a second half of a syncword 108. For example, the circuitry 102 may determine 206 the third frequency offset average 114 by taking the average of the instantaneous frequency offsets over the second half of the syncword 108 period.

The circuitry 102 may determine 208 an effective frequency offset 116 at an end of the syncword 108 based on the first frequency offset average 110, the second frequency offset average 112 and the third frequency offset average 114. For example, the circuitry 102 may determine 208 the effective frequency offset 116 by adding the third frequency offset average 114 to the second frequency offset average 112 and subtracting the first frequency offset average 110.

Figure 3:
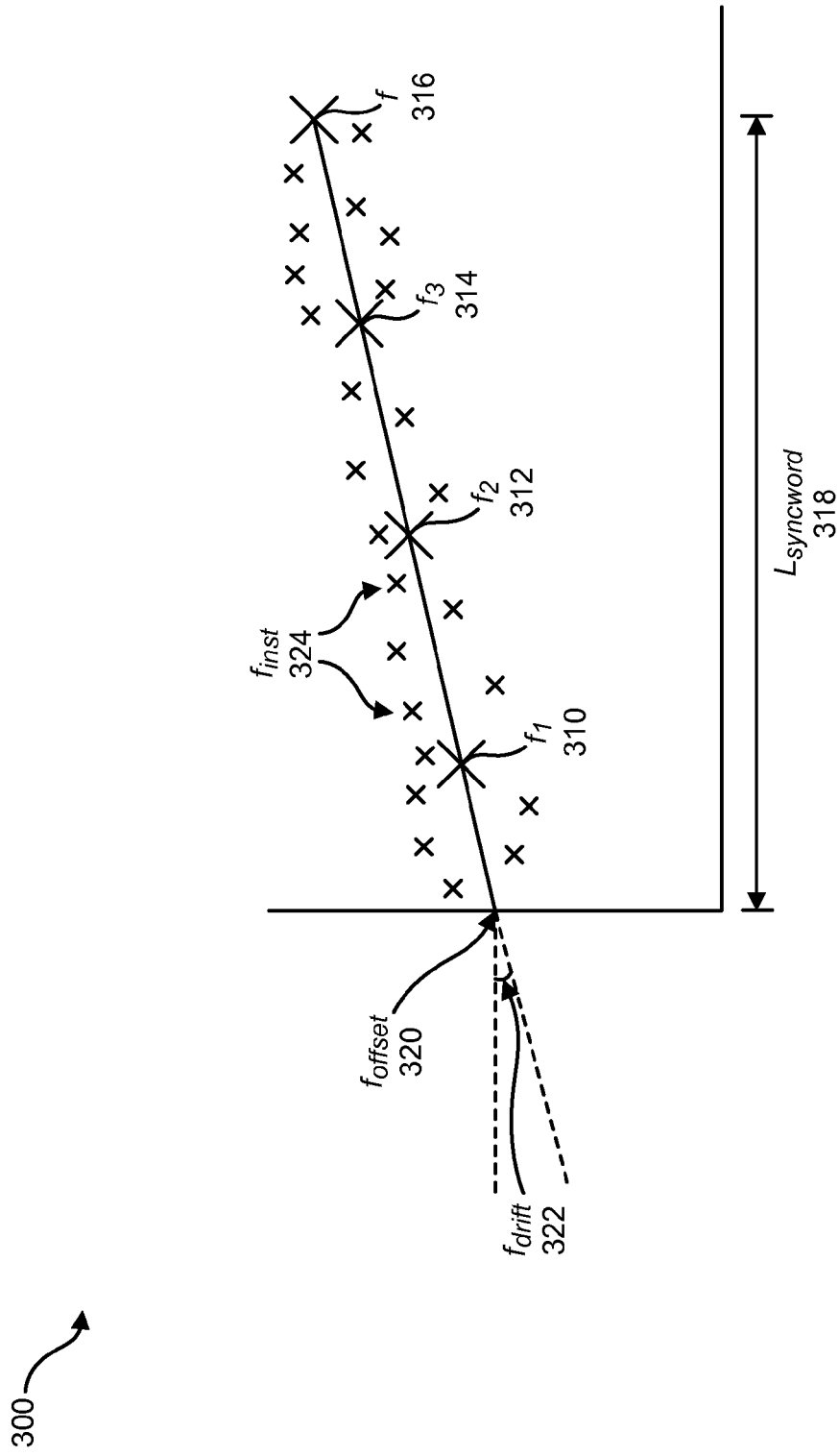
FIG. 3 is a graph illustrating an example of frequency offsets during the syncword period.

FIG. 3 is a graph 300 illustrating an example of frequency offsets during the syncword period 318. The syncword period ($L_{syncword}$) 318 is a length of the syncword 108 in time (e.g., a number of samples, the amount of time that elapses while the circuitry 102 receives a syncword 108, etc.). The circuitry 102 may determine instantaneous frequency offsets ($f_{inst}$) 324 corresponding to the syncword period 318. The instantaneous frequency offsets 324 may represent the difference between a carrier center frequency (e.g., the transmitted frequency) and the received data transmission frequencies. The instantaneous frequency offsets ($f_{inst}$) 324 are denoted as small diagonal crosses in FIG. 3.

The instantaneous frequency offsets 324 may be modeled with two components. In particular, the instantaneous frequency offsets 324 may be modeled with a constant frequency offset ($f_{offset}$) 320 and a frequency drift ($f_{drift}$) 322 component (that increases linearly with time, for example). The frequency drift 322 may be represented as the slope or angle of a line. In some cases, over the syncword period 318, the contribution of the frequency drift 322 to the total frequency offset increases as depicted in FIG. 3, for example.

The effective frequency offset (f) 316 represents the combination of the frequency offset 320 and the frequency drift 322 at the end of the syncword period 318. The effective frequency offset 316 may be expressed according to Equation (2) as described above. In accordance with the systems and methods disclosed herein, an estimation of the effective frequency offset 316 may be determined based on three frequency offset averages 310, 312, 314.

A first frequency offset average ($f_1$) 310 may be determined for the first half of the syncword period 318. The first frequency offset average 310 may be expressed according to Equation (3).

$$f_1 = f_{offset} + \frac{1}{4} \cdot L_{syncword} \cdot f_{drift} \qquad (3)$$

The first frequency offset average 310 may be approximated by averaging the instantaneous frequency offsets over the first half of the syncword period 318. In some configurations, the approximation of the first frequency offset average 310 may be expressed according to Equation (4).

$$f_1 = \frac{2}{n} \sum_{i=1}^{n/2} f_{inst\_i} \qquad (4)$$

In Equation (4), n is the number of instantaneous frequency offsets 324 in the syncword period ($L_{syncword}$) 318 and $f_{inst\_i}$ is the i-th instantaneous frequency offset 324. It should be noted that n/2 is the number of instantaneous frequency offsets 324 for half of the syncword period 318.

A second frequency offset average ($f_2$) 312 may be determined for the entire syncword period 318. The second frequency offset average 312 may be expressed according to Equation (5).

$$f_2 = f_{offset} + \frac{1}{2} \cdot L_{syncword} \cdot f_{drift} \qquad (5)$$

The second frequency offset average 312 may be approximated by averaging the instantaneous frequency offsets over the entire syncword period 318. The approximation of the second frequency offset average 312 may be expressed according to Equation (6).

$$f_2 = \frac{1}{n} \sum_{i=1}^{n} f_{inst\_i} \qquad (6)$$

A third frequency offset average ($f_3$) 314 may be determined for the second half of the syncword period 318. The third frequency offset average 314 may be expressed according to Equation (7).

$$f_3 = f_{offset} + \frac{3}{4} \cdot L_{syncword} \cdot f_{drift} \qquad (7)$$

The third frequency offset average 314 may be approximated by averaging the instantaneous frequency offsets over the second half of the syncword period 318. The approximation of the third frequency offset average 314 may be expressed according to Equation (8).

$$f_3 = \frac{2}{n} \sum_{i=(n/2)+1}^{n} f_{inst\_i} \qquad (8)$$

The effective frequency offset 316 at the end of the syncword period 318 may be determined based on the first frequency offset average 310, the second frequency offset average 312 and the third frequency offset average 314. The effective frequency offset 316 is equal to the second frequency offset average 312 plus the third frequency offset average 314 minus the first frequency offset average 310 as illustrated in Equation (9).

$$f = f_2 + f_3 - f_1 \qquad (9)$$

For clarity, one example of the theory of operation of the systems and methods disclosed herein is provided as follows. Assume that $L_{syncword}$=16 (e.g., 16 bits). Accordingly, f=$f_{off}$+16·$f_{drift}$. The first frequency offset average (evaluated from symbol 1 to symbol 8) is $f_1$=$f_{offset}$+

$$f_1 = f_{offset} + \left(\frac{8+0}{2}\right) \cdot f_{drift} = f_{offset} + 4 \cdot f_{drift}.$$

·$f_{drift}$=$f_{offset}$+4·$f_{drift}$. The second frequency offset average (evaluated from symbol 1 to symbol 16) is $f_2$=$f_{offset}$+

$$f_2 = f_{offset} + \left(\frac{16+0}{2}\right) \cdot f_{drift} = f_{offset} + 8 \cdot f_{drift}.$$

$f_{drift}$=$f_{offset}$+8·$f_{drift}$. The third frequency offset average (evaluated from symbol 9 to symbol 16) is $f_3$=$f_{offset}$+

$$f_3 = f_{offset} + \left(\frac{16+8}{2}\right) \cdot f_{drift} = f_{offset} + 12 \cdot f_{drift}.$$

·$f_{drift}$=$f_{offset}$+12·$f_{drift}$. Thus, the effective frequency offset 316 can be calculated from the three available instantaneous frequency offsets as f=$f_2$+$f_3$-$f_1$=$f_{offset}$+16·$f_{drift}$.

Figure 4:
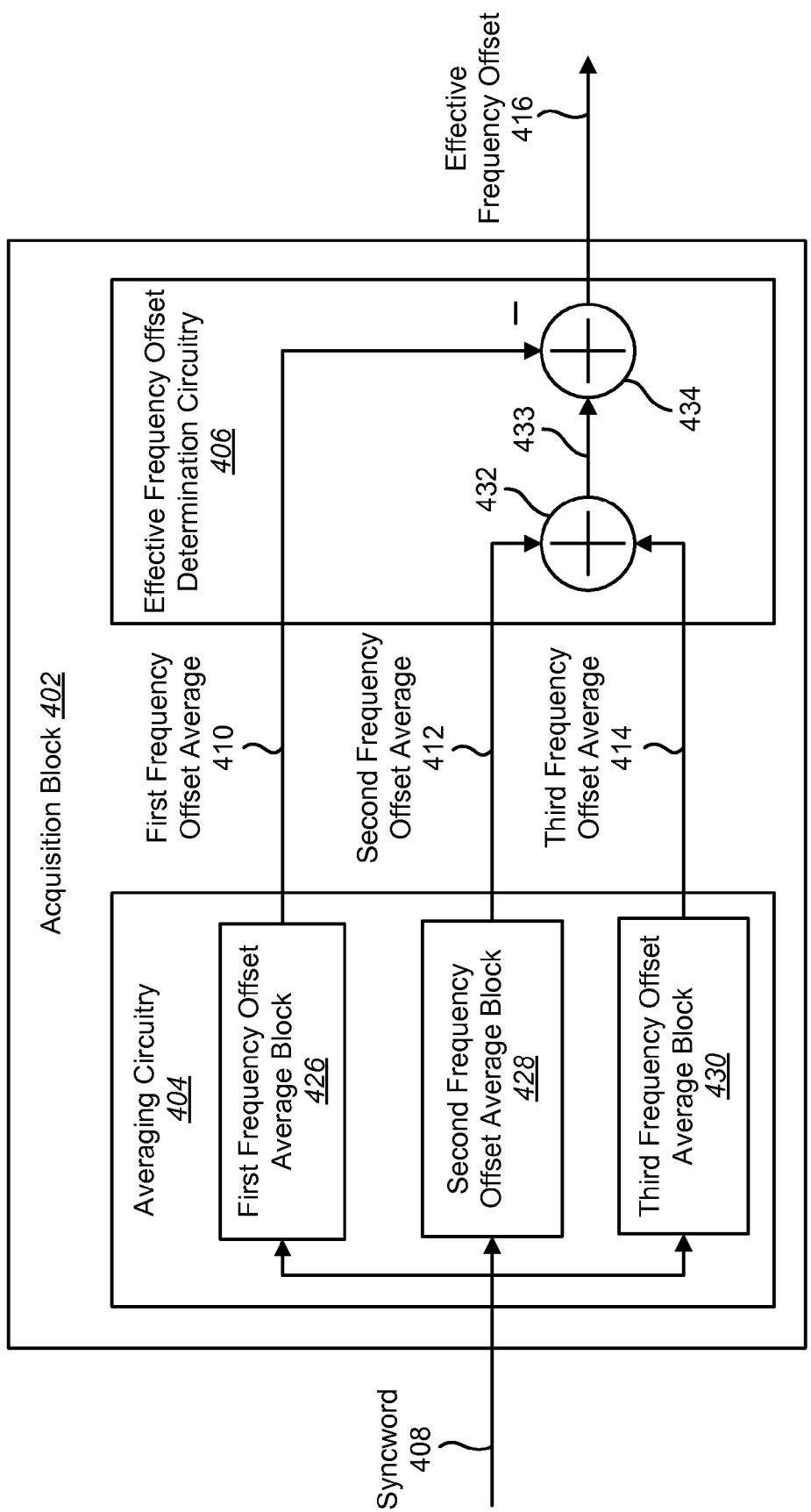
FIG. 4 is a block diagram illustrating one configuration of an acquisition block for determining an effective frequency offset.

FIG. 4 is a block diagram illustrating one configuration of an acquisition block 402 for determining an effective frequency offset 416. The acquisition block 402 may be one example of the circuitry 102 described above in connection with FIG. 1. For example, the acquisition block 402 may include averaging circuitry 404 and effective frequency offset determination circuitry 406 that corresponds to the averaging circuitry 104 and the effective frequency offset determination circuitry 106 as described above in connection with FIG. 1.

The acquisition block 402 may be implemented with a plurality of circuit components. The acquisition block 402 may include one or more resistors, capacitors, inductors, transistors, logic gates, registers, memory cells, processing blocks and/or switches, etc. For instance, the acquisition block 402 may be implemented as an integrated circuit, an application-specific integrated circuit (ASIC), field-programmable gate array (FPGA), etc.

The acquisition block 402 may include averaging circuitry 404. The averaging circuitry 404 may receive a syncword 408. In some configurations, the syncword 408 may be included in a packet that may be transmitted in a bit stream (e.g., a modulated signal). The acquisition block 402 may identify the syncword 408 in the packet. Upon identifying the syncword 408, the acquisition block 402 may determine the effective frequency offset 416 based on the syncword 408.

The averaging circuitry 404 may include frequency offset average blocks 426, 428, 430. The frequency offset average blocks 426, 428, 430 may determine frequency offset averages 410, 412, 414 over various parts of the syncword 408. A first frequency offset average block 426 may determine a first frequency offset average 410 over the first half of the syncword 408. A second frequency offset average block 428 may determine a second frequency offset average 412 over the entire syncword 408. A third frequency offset average block 430 may determine a third frequency offset average 414 over the second half of the syncword 408.

The averaging circuitry 404 may determine the frequency offset averages 410, 412, 414 based on instantaneous frequency offsets 324 as described above in connection with FIG. 3. For example, upon identifying the syncword 408, the acquisition block 402 may determine instantaneous frequency offsets 324 over the entire syncword. The first frequency offset average block 426 may determine the first frequency offset average 410 by taking the average of the instantaneous frequency offsets 324 in the first half of the syncword 408. This may be performed as illustrated above in Equation (4).

The second frequency offset average block 428 may determine the second frequency offset average 412 by taking the average of the instantaneous frequency offsets 324 over the entire syncword 408. This may be performed as illustrated above in Equation (6).

The third frequency offset average block 430 may determine the third frequency offset average 414 by taking the average of the instantaneous frequency offsets 324 in the second half of the syncword 408. This may be performed as illustrated above in Equation (8). It should be noted that the frequency offset average blocks 426, 428, 430 may be implemented in a hardware, software or a combination of hardware and software.

The acquisition block 402 may include effective frequency offset determination circuitry 406 to determine the effective frequency offset 416. In one configuration, the effective frequency offset determination circuitry 406 may receive the frequency offset averages 410, 412, 414 from the averaging circuitry 404. The effective frequency offset determination circuitry 406 may include a first adder 432 and a second adder 434. The first adder 432 may add the second frequency offset average 412 and the third frequency offset average 414 to produce a sum 433. The sum 433 may be provided to the second adder 434. The second adder 434 may subtract the first frequency offset average 410 from the sum 433 to determine the effective frequency offset 416.

Figure 5:
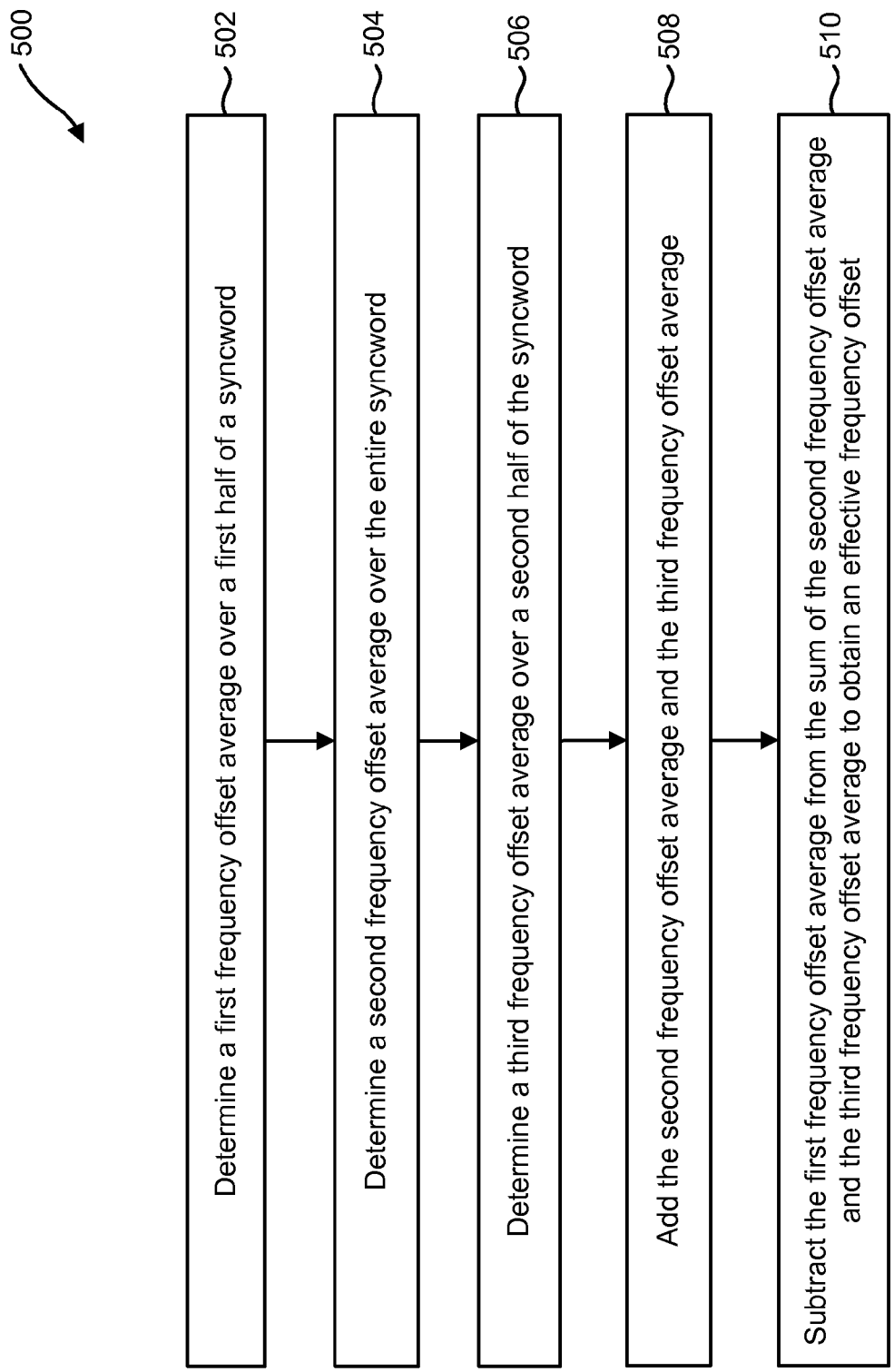
FIG. 5 is a flow diagram illustrating a more specific configuration of a method for determining an effective frequency offset.

FIG. 5 is a flow diagram illustrating a more specific configuration of a method 500 for determining an effective frequency offset 416. The method 500 may be performed by an acquisition block 402, which may be configured as described above in connection with FIG. 4. The acquisition block 402 may receive a syncword 408. Upon receiving the syncword 108, the acquisition block 402 may determine instantaneous frequency offsets 324 over the syncword period 318. In one configuration, the acquisition block may include averaging circuitry 404. The averaging circuitry 404 may include frequency offset average blocks 426, 428, 430.

The acquisition block 402 may determine 502 a first frequency offset average 410 over a first half of a syncword 408. For example, a first frequency offset average block 426 may determine 502 the first frequency offset average 410 by taking the average of the instantaneous frequency offsets 324 over the first half of the syncword period 318. This may be performed as illustrated above in Equation (4).

The acquisition block 402 may determine 504 a second frequency offset average 412 over the entire syncword 408. For example, a second frequency offset average block 428 may determine 504 the second frequency offset average 412 by taking the average of the instantaneous frequency offsets 324 over the entire syncword period 318. This may be performed as illustrated above in Equation (6).

The acquisition block 402 may determine 506 a third frequency offset average 414 over a second half of a syncword 408. For example, a third frequency offset average block 430 may determine 506 the third frequency offset average 414 by taking the average of the instantaneous frequency offsets 324 over the second half of the syncword period 318. This may be performed as illustrated above in Equation (8).

The acquisition block 402 may add 508 the second frequency offset average 412 and the third frequency offset average 414. In one configuration, the addition 508 of the second frequency offset average 412 and the third frequency offset average 414 may be performed by effective frequency offset determination circuitry 406. The effective frequency offset determination circuitry 406 may include a first adder 432 that may add 508 the second frequency offset average 412 and the third frequency offset average 414 to produce a sum 433.

The acquisition block 402 may subtract 510 the first frequency offset average 410 from the sum 433 of the second frequency offset average 412 and the third frequency offset average 414 to obtain an effective frequency offset 416. In one configuration, this subtraction 510 may be performed by the effective frequency offset determination circuitry 406. The effective frequency offset determination circuitry 406 may include a second adder 434 that may subtract 510 the first frequency offset average 414 from the sum 433 of the second frequency offset average 412 and the third frequency offset average 414. The output of the second adder 434 is the effective frequency offset 416.

Figure 6:
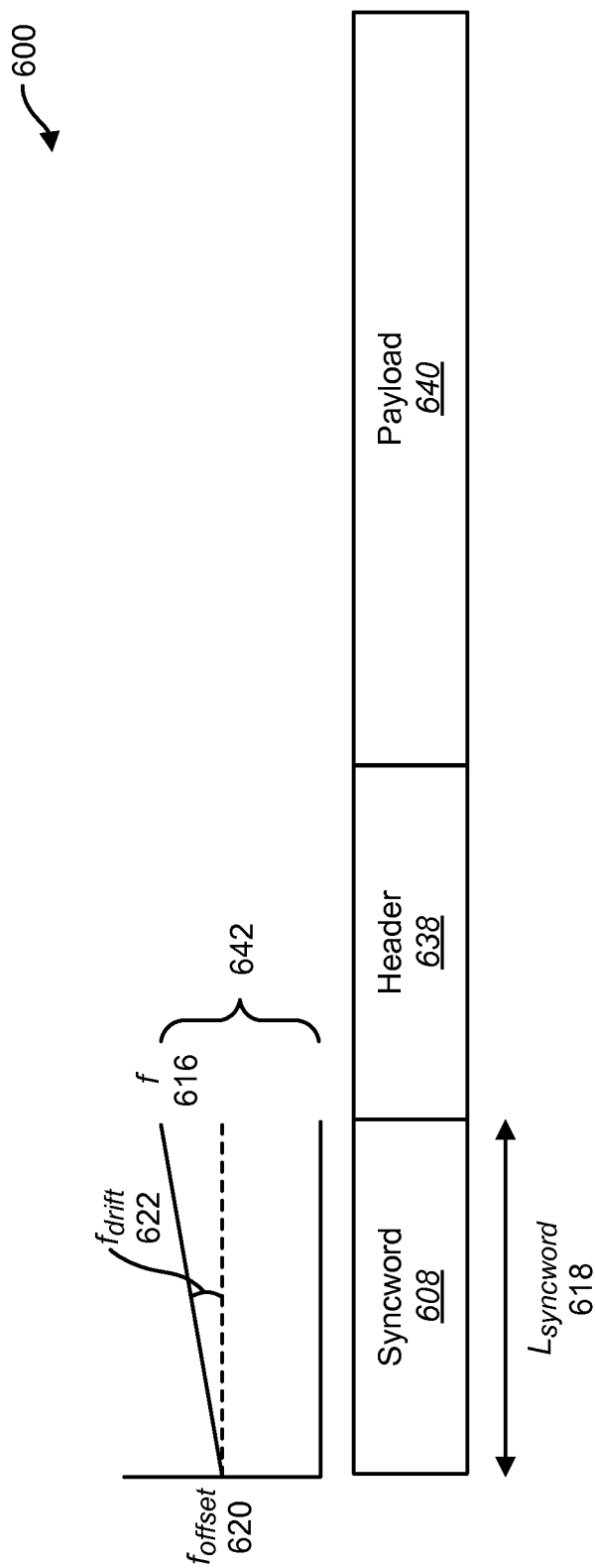
FIG. 6 is a block diagram illustrating one example of a packet in accordance with the systems and methods disclosed herein.

FIG. 6 is a block diagram illustrating one example of a packet 600 in accordance with the systems and methods disclosed herein. The packet 600 may include a syncword 608, a header 638 and a payload 640. The packet 600 may be received from a transmitting device. For example, the transmission may be an RF signal transmission between a transmitter and a receiver. Upon receiving the RF signal transmission, the receiver may convert the signal into a digital signal. The digital signal may be a modulated signal.

The syncword 608 may be used to synchronize the transmission. For example, circuitry 102 (e.g., an acquisition block 402) may identify the syncword 608 that is included in the packet 600. In one configuration, the circuitry 102 may perform a pattern search to identify the syncword 608. Upon identifying the syncword 608, the circuitry 102 may determine an effective frequency offset 616 according to the systems and methods described herein.

The header 638 may provide details about the payload 640. The payload 640 may include the data that forms the subject of the data transmission. In one configuration, the header 638 and payload 640 may be demodulated based on the effective frequency offset 616.

The effects of frequency offset ($f_{offset}$) 620 and frequency drift ($f_{drift}$) 622 over the syncword period 618 are depicted in a graph 642 in FIG. 6. The syncword period 618 is the length of the syncword 608 in time (e.g., a number of clock cycles, samples, etc.). The circuitry 102 may determine an effective frequency offset (f) 616. As described above, the effective frequency offset (f) 616 may be modeled with a frequency offset ($f_{offset}$) 620 and frequency drift ($f_{drift}$) 622. Therefore, the effective frequency offset (f) 616 may be modeled as the combination of the frequency offset 620 and the frequency drift 622 at the end of the syncword period 618. The effective frequency offset 616 may be determined according to the systems and methods described herein.

Figure 7:
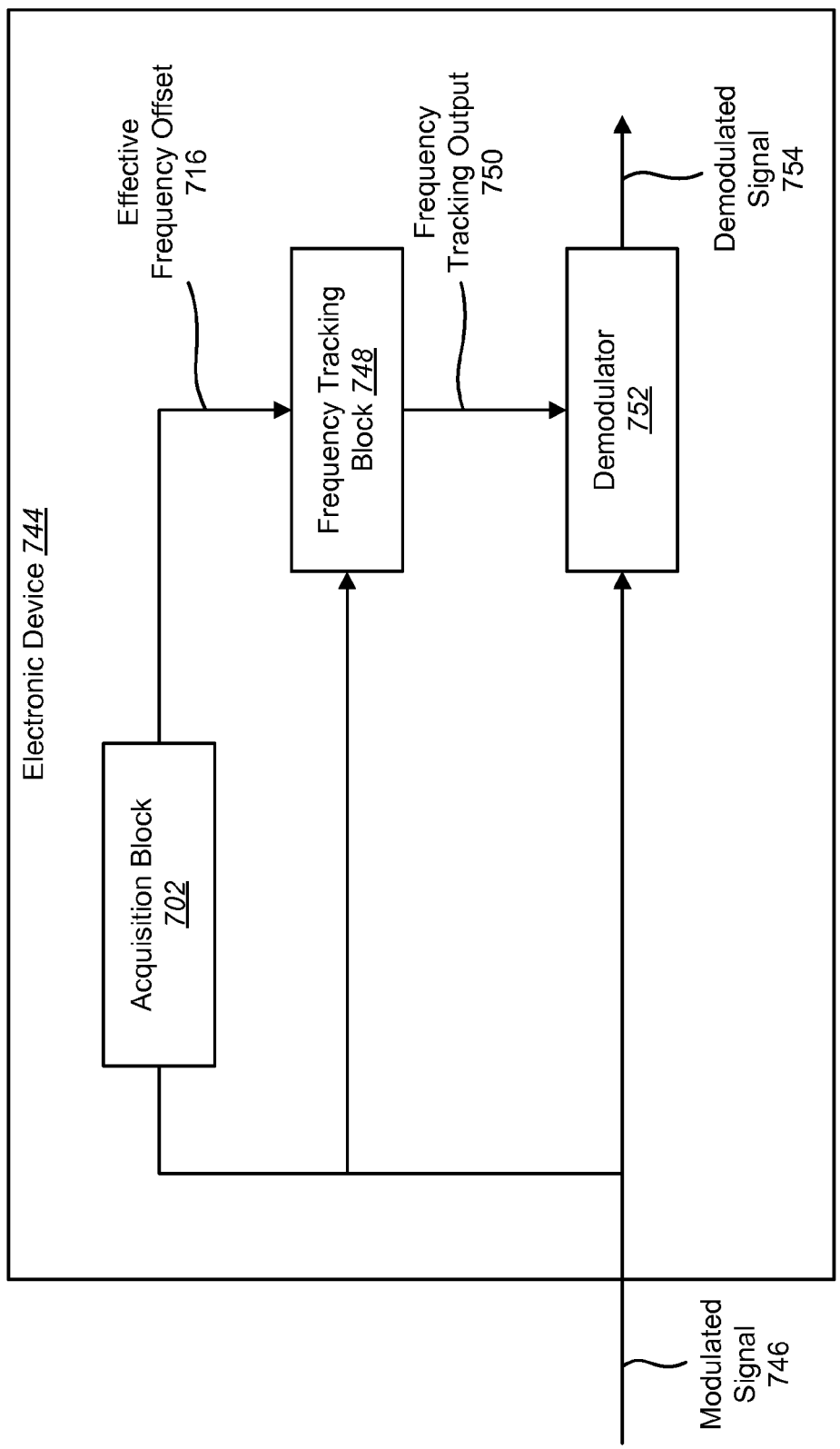
FIG. 7 is a block diagram illustrating one configuration of a receiver in accordance with the systems and methods disclosed herein.

FIG. 7 is a block diagram illustrating one configuration of an electronic device 744 in accordance with the systems and methods disclosed herein. Examples of the electronic device 744 include wireless communication devices, cellular phones, smartphones, wired and wireless receivers, etc. In one configuration, the electronic device 744 includes an acquisition block 702, a frequency tracking block 748 and a demodulator 752. The electronic device 744 may receive a modulated signal 746. The modulated signal 746 may include a packet 600 as described above in connection with FIG. 6.

The acquisition block 702 illustrated in FIG. 7 may be one example of one or more of the circuitry 102 or acquisition block 402 described in connection with FIG. 1 and/or FIG. 4. For example, the acquisition block 702 may detect a syncword 108 included in the modulated signal 746. Upon detecting the syncword 108, the acquisition block 702 may determine an effective frequency offset 716 according to the systems and methods described herein.

The frequency tracking block 748 may receive the effective frequency offset 716 and the modulated signal 746. The frequency tracking block 748 may compensate for the frequency offset 320 and the frequency drift 322 based on the effective frequency offset 716. In some configurations, frequency tracking may be based on a control loop. For the control loop to be accurate, it needs to be initialized with an accurate estimate of the frequency offset. Therefore, the frequency tracking block 748 may use the effective frequency offset 716 at the end of the syncword in a control loop to produce compensation information (when tracking is begun, for example). This compensation information may be included in the frequency tracking output 750.

The demodulator 752 may receive the frequency tracking output 750. The demodulator 752 may demodulate the modulated signal 746 based on the frequency tracking output 750. For example, the demodulator 752 may demodulate the header 638 and payload 640 that may be included in the modulated signal 746, while compensating for frequency offset 320 and frequency drift 322. Therefore, the demodulator 752 may produce a demodulated signal 754 that is compensated by the effective frequency offset 716.

Figure 8:
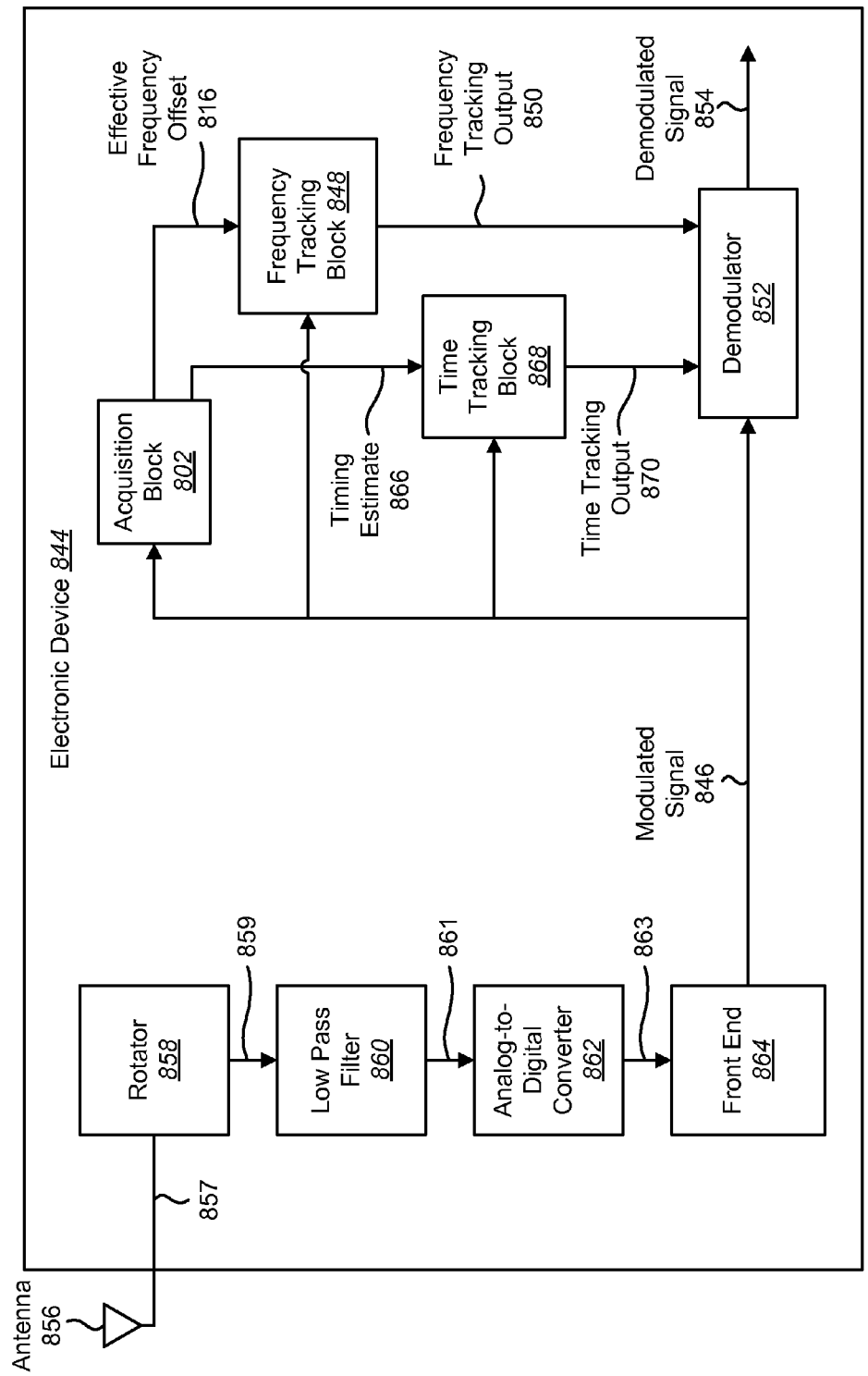
FIG. 8 is a block diagram illustrating a more specific configuration of a receiver in accordance with the systems and methods disclosed herein.

FIG. 8 is a block diagram illustrating a more specific configuration of an electronic device 844 in accordance with the systems and methods disclosed herein. Examples of the electronic device 844 include wireless communication devices, cellular phones, smartphones, wired and wireless receivers, etc. In one configuration, the electronic device 844 includes an antenna 856. The antenna 856 may receive an RF signal 857. For example, the antenna 856 may receive an RF signal 857 from a transmitter. The RF signal 857 may be a transmission, which may include a packet 600 as described above in connection with FIG. 6.

The received RF signal 857 may be processed by the electronic device 844. For example, a rotator 858 may adjust the phase rotation of the RF signal 857 to produce a rotated signal 859. A low pass filter 860 may produce a filtered signal 861. An analog-to-digital converter 862 may convert the analog signal to a digital signal 863. The front end 864 may include additional components (e.g., impedance matching circuitry, filters, amplifiers, and/or mixers) that may further process the digital signal 863 to produce a modulated signal 846.

The receiver may include an acquisition block 802. The acquisition block 802 illustrated in FIG. 8 may be one example of one or more of the circuitry 102 or acquisition blocks 402, 702 described in connection with FIG. 1, FIG. 4 and/or FIG. 7. For example, the acquisition block 802 may detect a syncword 108 included in the modulated signal 846. Upon detecting the syncword 108, the acquisition block 802 may determine an effective frequency offset 816 according to the systems and methods described herein. The acquisition block 802 may additionally determine a timing estimate 866. For example, the acquisition block 802 may use a matched filter and lock onto the known syncword 108 pattern.

The acquisition block 802 may provide the effective frequency offset 816 to the frequency tracking block 848. The frequency tracking block 848 may receive the effective frequency offset 816 and the modulated signal 846. The frequency tracking block 848 may produce a frequency tracking output 850 as described above in connection with FIG. 7.

The electronic device 844 may include a time tracking block 868. The time tracking block 868 may receive the modulated signal 846 and the timing estimate 866. The time tracking block 868 may produce a time tracking output 870. For example, the time tracking block 848 may keep track of the accurate sampling phase (e.g., the on-time phase). The sampling phase may drift because of clock inaccuracies. Therefore, the time tracking block 848 may compensate for the sampling phase drift, which may be indicated in the time tracking output 870.

The demodulator 852 may receive the frequency tracking output 850 and the time tracking output 870. The demodulator 852 may demodulate the modulated signal 846 based on the frequency tracking output 850 and the time tracking output 870. For example, the demodulator 852 may demodulate the modulated signal 846 based on the frequency tracking output 850 as described in connection with FIG. 7. The demodulator 852 may additionally demodulate the modulated signal 846 based on the time tracking output 870. Therefore, the demodulator 852 may compensate for frequency and timing when producing a demodulated signal 854.

Figure 9:
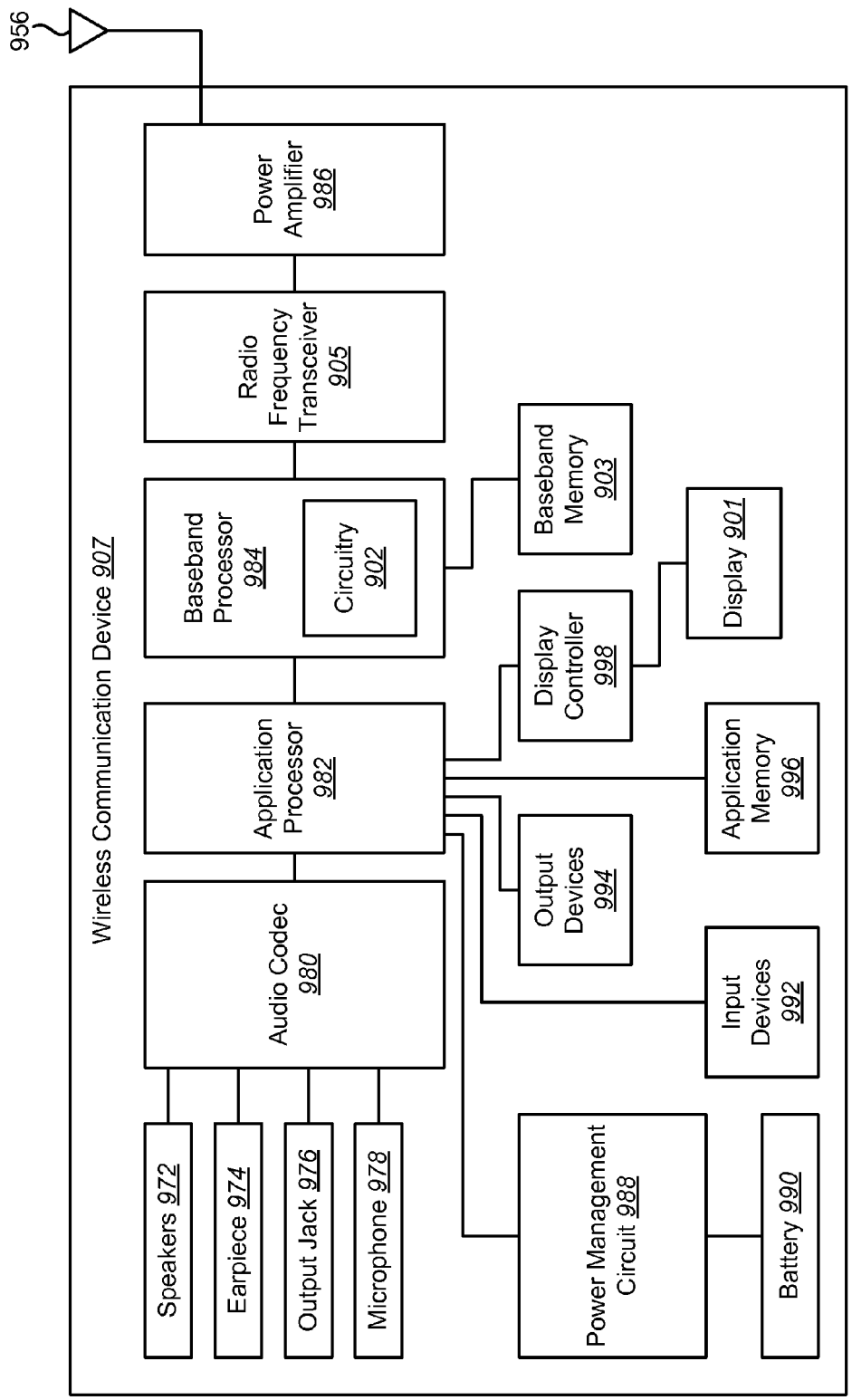
FIG. 9 is a block diagram illustrating one configuration of a wireless communication device in which systems and methods for performing digital modulation may be implemented.

FIG. 9 is a block diagram illustrating one configuration of a wireless communication device 907 in which systems and methods for performing frequency offset estimation may be implemented. The wireless communication device 907 illustrated in FIG. 9 may include one or more of the circuitry 102, acquisition blocks 402, 702, 802 and/or other devices/circuitries described above. The wireless communication device 907 may include an application processor 982. The application processor 982 generally processes instructions (e.g., runs programs) to perform functions on the wireless communication device 907. The application processor 982 may be coupled to an audio coder/decoder (codec) 980.

The audio codec 980 may be an electronic device (e.g., integrated circuit) used for coding and/or decoding audio signals. The audio codec 980 may be coupled to one or more speakers 972, an earpiece 974, an output jack 976 and/or one or more microphones 978. The speakers 972 may include one or more electro-acoustic transducers that convert electrical or electronic signals into acoustic signals. For example, the speakers 972 may be used to play music or output a speakerphone conversation, etc. The earpiece 974 may be another speaker or electro-acoustic transducer that can be used to output acoustic signals (e.g., speech signals) to a user. For example, the earpiece 974 may be used such that only a user may reliably hear the acoustic signal. The output jack 976 may be used for coupling other devices to the wireless communication device 907 for outputting audio, such as headphones. The speakers 972, earpiece 974 and/or output jack 976 may generally be used for outputting an audio signal from the audio codec 980. The one or more microphones 978 may be acousto-electric transducer that converts an acoustic signal (such as a user's voice) into electrical or electronic signals that are provided to the audio codec 980.

The application processor 982 may also be coupled to a power management circuit 988. One example of a power management circuit 988 is a power management integrated circuit (PMIC), which may be used to manage the electrical power consumption of the wireless communication device 907. The power management circuit 988 may be coupled to a battery 990. The battery 990 may generally provide electrical power to the wireless communication device 907. For example, the battery 990 and/or the power management circuit 988 may be coupled to one or more of the elements included in the wireless communication device 907.

The application processor 982 may be coupled to one or more input devices 992 for receiving input. Examples of input devices 992 include infrared sensors, image sensors, accelerometers, touch sensors, keypads, etc. The input devices 992 may allow user interaction with the wireless communication device 907. The application processor 982 may also be coupled to one or more output devices 994. Examples of output devices 994 include printers, projectors, screens, haptic devices, etc. The output devices 994 may allow the wireless communication device 907 to produce output that may be experienced by a user.

The application processor 982 may be coupled to application memory 996. The application memory 996 may be any electronic device that is capable of storing electronic information. Examples of application memory 996 include double data rate synchronous dynamic random access memory (DDRAM), synchronous dynamic random access memory (SDRAM), flash memory, etc. The application memory 996 may provide storage for the application processor 982. For instance, the application memory 996 may store data and/or instructions for the functioning of programs that are run on the application processor 982.

The application processor 982 may be coupled to a display controller 998, which in turn may be coupled to a display 901. The display controller 998 may be a hardware block that is used to generate images on the display 901. For example, the display controller 998 may translate instructions and/or data from the application processor 982 into images that can be presented on the display 901. Examples of the display 901 include liquid crystal display (LCD) panels, light emitting diode (LED) panels, cathode ray tube (CRT) displays, plasma displays, etc.

The application processor 982 may be coupled to a baseband processor 984. The baseband processor 984 generally processes communication signals. For example, the baseband processor 984 may demodulate and/or decode received signals. Additionally or alternatively, the baseband processor 984 may encode and/or modulate signals in preparation for transmission.

The baseband processor 984 may be coupled to baseband memory 903. The baseband memory 903 may be any electronic device capable of storing electronic information, such as SDRAM, DDRAM, flash memory, etc. The baseband processor 984 may read information (e.g., instructions and/or data) from and/or write information to the baseband memory 903. Additionally or alternatively, the baseband processor 984 may use instructions and/or data stored in the baseband memory 903 to perform communication operations.

The baseband processor 984 may include circuitry 902 for performing frequency offset estimation in accordance with the systems and methods disclosed herein. The circuitry 902 may be configured similarly to one or more of the circuitry 102 and/or acquisition blocks 402, 702, 802 described herein. Additionally or alternatively, the circuitry 902 may perform one or more of the methods 200, 500 and/or one or more of the functions described in connection with one or more of the circuitry 102 and/or acquisition blocks 402, 702, 802 described above. In some configurations, the circuitry 902 may be alternatively implemented independently from the baseband processor 984.

The baseband processor 984 may be coupled to an RF transceiver 905. The RF transceiver 905 may be coupled to a power amplifier 986 and one or more antennas 956. The RF transceiver 905 may transmit and/or receive radio frequency signals. For example, the RF transceiver 905 may transmit an RF signal using a power amplifier 986 and one or more antennas 956. The RF transceiver 905 may also receive RF signals using the one or more antennas 956.

Figure 10:
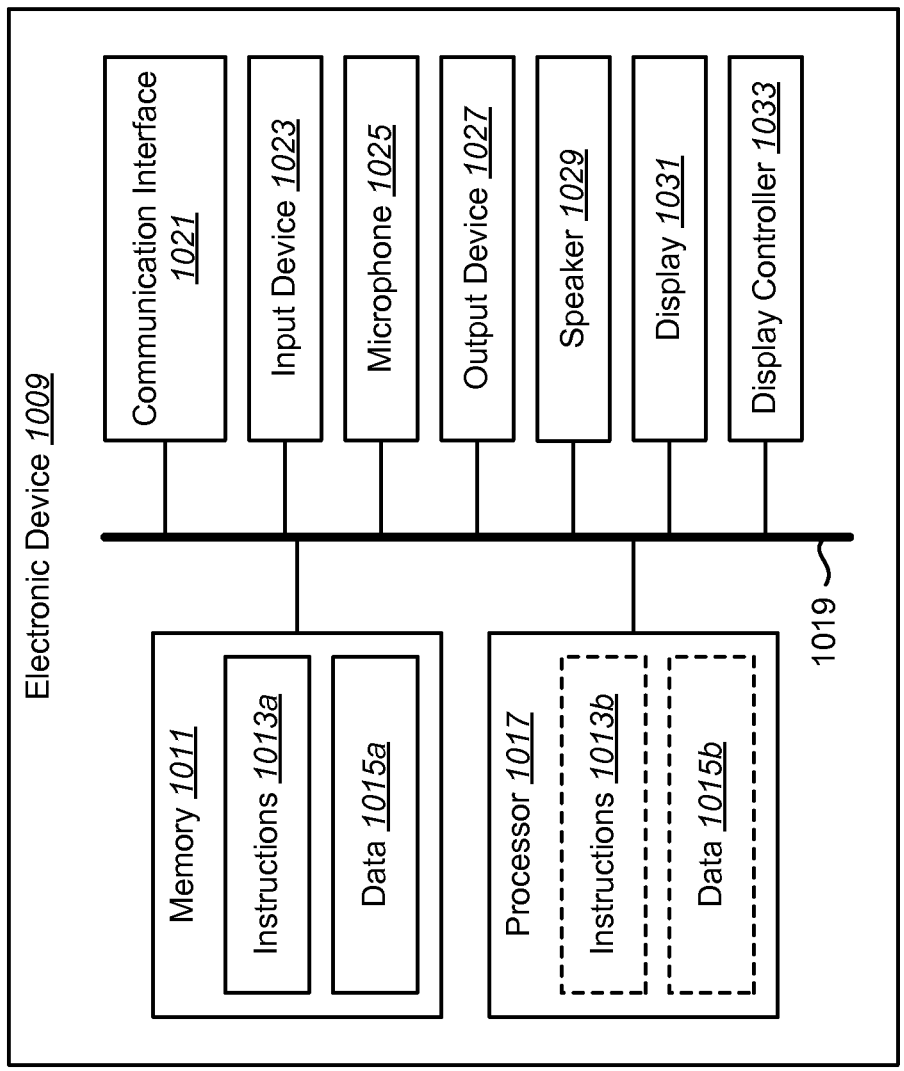
FIG. 10 illustrates various components that may be utilized in an electronic device.

FIG. 10 illustrates various components that may be utilized in an electronic device 1009. The illustrated components may be located within the same physical structure or in separate housings or structures. The electronic device 1009 described in connection with FIG. 10 may include one or more of the circuitry 102, acquisition blocks 402, 702, 802 and/or other devices/circuitries described above. Additionally or alternatively, the electronic device 1009 may be implemented in accordance with the wireless communication device 907 described herein. The electronic device 1009 described in connection with FIG. 10 may include one or more of the circuitry 102, acquisition blocks 402, 702, 802 and/or other devices/circuitries described above. Additionally or alternatively, the electronic device 1009 may be implemented in accordance with one or more of the electronic devices 744, 844 and the wireless communication device 907 described herein. The electronic device 1009 includes a processor 1017. The processor 1017 may be a general purpose single- or multi-chip microprocessor (e.g., an ARM), a special purpose microprocessor (e.g., a digital signal processor (DSP)), a microcontroller, a programmable gate array, etc. The processor 1017 may be referred to as a central processing unit (CPU). Although just a single processor 1017 is shown in the electronic device 1009 of FIG. 10, in an alternative configuration, a combination of processors (e.g., an ARM and DSP) could be used.

The electronic device 1009 also includes memory 1011 in electronic communication with the processor 1017. That is, the processor 1017 can read information from and/or write information to the memory 1011. The memory 1011 may be any electronic component capable of storing electronic information. The memory 1011 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1015*a* and instructions 1013*a* may be stored in the memory 1011. The instructions 1013*a* may include one or more programs, routines, sub-routines, functions, procedures, etc. The instructions 1013*a* may include a single computer-readable statement or many computer-readable statements. The instructions 1013*a* may be executable by the processor 1017 to implement one or more of the methods 200, 500 described above. Executing the instructions 1013*a* may involve the use of the data 1015*a* that is stored in the memory 1011. FIG. 10 shows some instructions 1013*b* and data 1015*b* being loaded into the processor 1017 (which may come from instructions 1013*a* and data 1015*a*).

The electronic device 1009 may also include one or more communication interfaces 1021 for communicating with other electronic devices. The communication interfaces 1021 may be based on wired communication technology, wireless communication technology, or both. Examples of different types of communication interfaces 1021 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 1009 may also include one or more input devices 1023 and one or more output devices 1027. Examples of different kinds of input devices 1023 include a keyboard, mouse, microphone, remote control device, button, joystick, trackball, touchpad, lightpen, etc. For instance, the electronic device 1009 may include one or more microphones 1025 for capturing acoustic signals. In one configuration, a microphone 1025 may be a transducer that converts acoustic signals (e.g., voice, speech) into electrical or electronic signals. Examples of different kinds of output devices 1027 include a speaker, printer, etc. For instance, the electronic device 1009 may include one or more speakers 1029. In one configuration, a speaker 1029 may be a transducer that converts electrical or electronic signals into acoustic signals. One specific type of output device which may be typically included in an electronic device 1009 is a display device 1031. Display devices 1031 used with configurations disclosed herein may utilize any suitable image projection technology, such as a cathode ray tube (CRT), liquid crystal display (LCD), light-emitting diode (LED), gas plasma, electroluminescence, or the like. A display controller 1033 may also be provided, for converting data stored in the memory 1011 into text, graphics, and/or moving images (as appropriate) shown on the display device 1031.

The various components of the electronic device 1009 may be coupled together by one or more buses, which may include a power bus, a control signal bus, a status signal bus, a data bus, etc. For simplicity, the various buses are illustrated in FIG. 10 as a bus system 1019. It should be noted that FIG. 10 illustrates only one possible configuration of an electronic device 1009. Various other architectures and components may be utilized.

Figure 11:
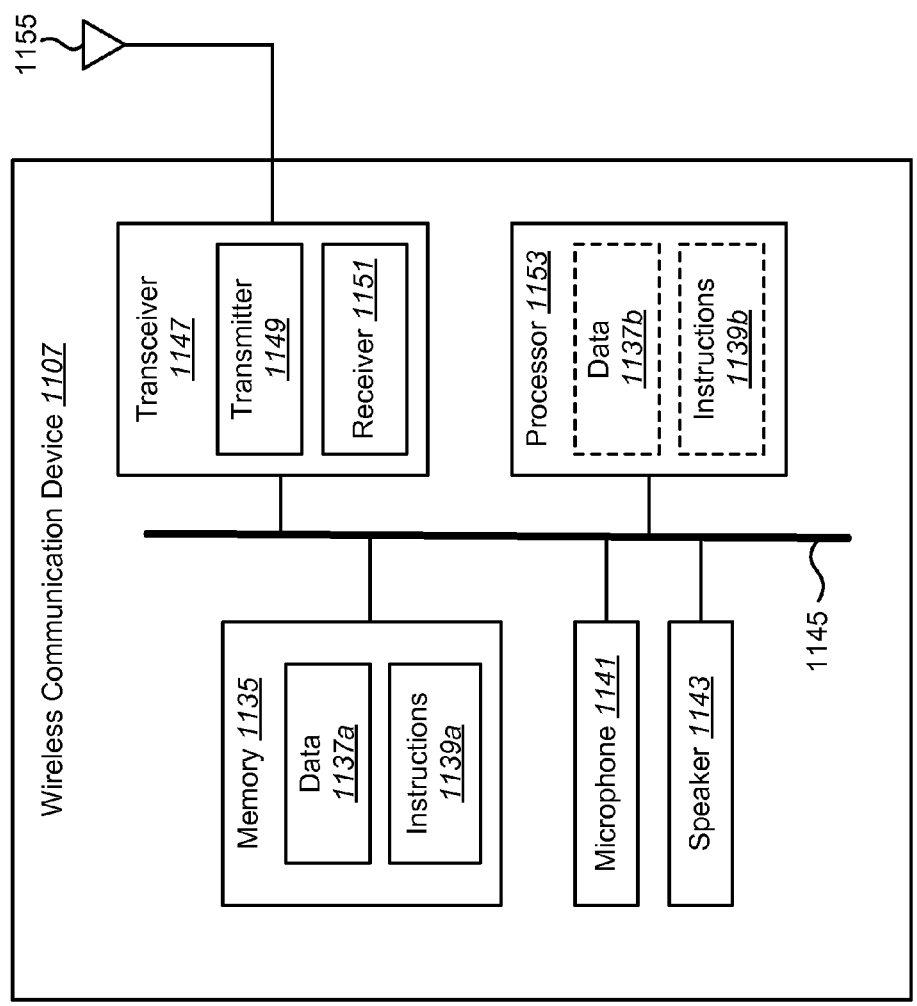
FIG. 11 illustrates certain components that may be included within a wireless communication device.

FIG. 11 illustrates certain components that may be included within a wireless communication device 1107. The wireless communication device 1107 described in connection with FIG. 11 may include one or more of the circuitry 102, acquisition blocks 402, 702, 802 and/or other devices/circuitries described above. Additionally or alternatively, the wireless communication device 1107 may be implemented in accordance with one or more of the electronic devices 744, 844 and the wireless communication device 907 described herein.

The wireless communication device 1107 includes a processor 1153. The processor 1153 may be a general purpose single- or multi-chip microprocessor (e.g., an ARM), a special purpose microprocessor (e.g., a digital signal processor (DSP)), a microcontroller, a programmable gate array, etc. The processor 1153 may be referred to as a central processing unit (CPU). Although just a single processor 1153 is shown in the wireless communication device 1107 of FIG. 11, in an alternative configuration, a combination of processors 1153 (e.g., an ARM and DSP) could be used.

The wireless communication device 1107 also includes memory 1135 in electronic communication with the processor 1153 (e.g., the processor 1153 can read information from and/or write information to the memory 1135). The memory 1135 may be any electronic component capable of storing electronic information. The memory 1135 may be random access memory (RAM), read-only memory (ROM), magnetic disk storage media, optical storage media, flash memory devices in RAM, on-board memory included with the processor 1153, programmable read-only memory (PROM), erasable programmable read-only memory (EPROM), electrically erasable PROM (EEPROM), registers, and so forth, including combinations thereof.

Data 1137*a* and instructions 1139*a* may be stored in the memory 1135. The instructions 1139*a* may include one or more programs, routines, sub-routines, functions, procedures, code, etc. The instructions 1139*a* may include a single computer-readable statement or many computer-readable statements. The instructions 1139*a* may be executable by the processor 1153 to implement one or more of the methods 200, 500 or functions described herein. Executing the instructions 1139*a* may involve the use of the data 1137*a* that is stored in the memory 1135. FIG. 11 shows some instructions 1139*b* and data 1137*b* being loaded into the processor 1153 (which may come from instructions 1139*a* and data 1137*a* in memory 1135).

The wireless communication device 1107 may also include a transmitter 1149 and a receiver 1151 to allow transmission and reception of signals between the wireless communication device 1107 and a remote location (e.g., another electronic device, wireless communication device, etc.). The transmitter 1149 and receiver 1151 may be collectively referred to as a transceiver 1147. An antenna 1155 may be electrically coupled to the transceiver 1147. The wireless communication device 1107 may also include (not shown) multiple transmitters 1149, multiple receivers 1151, multiple transceivers 1147 and/or multiple antennas 1155.

In some configurations, the wireless communication device 1107 may include one or more microphones 1141 for capturing acoustic signals. In one configuration, a microphone 1141 may be a transducer that converts acoustic signals (e.g., voice, speech, noise, etc.) into electrical or electronic signals. Additionally or alternatively, the wireless communication device 1107 may include one or more speakers 1143. In one configuration, a speaker 1143 may be a transducer that converts electrical or electronic signals into acoustic signals.

The various components of the wireless communication device 1107 may be coupled together by one or more buses, which may include a power bus, a control signal bus, a status signal bus, a data bus, etc. For simplicity, the various buses are illustrated in FIG. 11 as a bus system 1145.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a digital signal processor (DSP) and a microprocessor, a plurality of microprocessors, one or more microprocessors in conjunction with a digital signal processor (DSP) core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

It should be noted that one or more of the features, functions, procedures, components, elements, structures, etc., described in connection with any one of the configurations described herein may be combined with one or more of the functions, procedures, components, elements, structures, etc., described in connection with any of the other configurations described herein, where compatible. In other words, any compatible combination of the functions, procedures, components, elements, etc., described herein may be implemented in accordance with the systems and methods disclosed herein.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for determining an effective frequency offset by circuitry, comprising:
    determining a first frequency offset average over a first half of a syncword;
    determining a second frequency offset average over the entire syncword;
    determining a third frequency offset average over a second half of the syncword; and
    determining an effective frequency offset at an end of the syncword based on the first frequency offset average, the second frequency offset average and the third frequency offset average.

2. The method of claim 1, wherein the effective frequency offset is equal to the second frequency offset average plus the third frequency offset average minus the first frequency offset average.

3. The method of claim 1, wherein determining the first frequency offset average over the first half of the syncword comprises averaging instantaneous frequency offsets over the first half of the syncword.

4. The method of claim 1, wherein determining the second frequency offset average over the entire syncword comprises averaging instantaneous frequency offsets over the entire syncword.

5. The method of claim 1, wherein determining the third frequency offset average over the second half of the syncword comprises averaging instantaneous frequency offsets over the second half of the syncword.

6. The method of claim 1, further comprising providing the effective frequency offset to an electronic device.

7. The method of claim 1, wherein the method is performed by an acquisition block.

8. The method of claim 1, wherein the effective frequency offset comprises a constant frequency offset component and a linearly varying frequency drift component.

9. Circuitry for determining an effective frequency offset, comprising:
    averaging circuitry that determines a first frequency offset average over a first half of a syncword, determines a second frequency offset average over the entire syncword, and determines a third frequency offset average over a second half of the syncword; and
    effective frequency offset determination circuitry coupled to the averaging circuitry, wherein the effective frequency offset determination circuitry determines an effective frequency offset at an end of the syncword based on the first frequency offset average, the second frequency offset average and the third frequency offset average.

10. The circuitry of claim 9, wherein the effective frequency offset is equal to the second frequency offset average plus the third frequency offset average minus the first frequency offset average.

11. The circuitry of claim 9, wherein determining the first frequency offset average over the first half of the syncword comprises averaging instantaneous frequency offsets over the first half of the syncword.

12. The circuitry of claim 9, wherein determining the second frequency offset average over the entire syncword comprises averaging instantaneous frequency offsets over the entire syncword.

13. The circuitry of claim 9, wherein determining the third frequency offset average over the second half of the syncword comprises averaging instantaneous frequency offsets over the second half of the syncword.

14. The circuitry of claim 9, wherein the effective frequency offset is provided to an electronic device.

15. The circuitry of claim 9, wherein the circuitry comprises an acquisition block.

16. The circuitry of claim 9, wherein the effective frequency offset comprises a constant frequency offset component and a linearly varying frequency drift component.

17. A computer-program product for determining an effective frequency offset, the computer-program product comprising a non-transitory tangible computer-readable medium having instructions thereon, the instructions comprising:
   code for causing circuitry to determine a first frequency offset average over a first half of a syncword;
   code for causing the circuitry to determine a second frequency offset average over the entire syncword;
   code for causing the circuitry to determine a third frequency offset average over a second half of the syncword; and
   code for causing the circuitry to determine an effective frequency offset at an end of the syncword based on the first frequency offset average, the second frequency offset average and the third frequency offset average.

18. The computer-program product of claim 17, wherein the effective frequency offset is equal to the second frequency offset average plus the third frequency offset average minus the first frequency offset average.

19. The computer-program product of claim 17, wherein the code for causing the circuitry to determine the first frequency offset average over the first half of the syncword comprises code for causing the circuitry to average instantaneous frequency offsets over the first half of the syncword.

20. The computer-program product of claim 17, wherein the code for causing the circuitry to determine the second frequency offset average over the entire syncword comprises code for causing the circuitry to average instantaneous frequency offsets over the entire syncword.

21. The computer-program product of claim 17, wherein the code for causing the circuitry to determine the third frequency offset average over second half of the syncword comprises code for causing the circuitry to average instantaneous frequency offsets over the second half of the syncword.

22. The computer-program product of claim 17, further comprising code for causing the circuitry to provide the effective frequency offset to an electronic device.

23. The computer-program product of claim 17, wherein the circuitry comprises an acquisition block.

24. The computer-program product of claim 17, wherein the effective frequency offset comprises a constant frequency offset component and a linearly varying frequency drift component.

25. An apparatus for determining an effective frequency offset, comprising:
   means for determining a first frequency offset average over a first half of a syncword;
   means for determining a second frequency offset average over the entire syncword;
   means for determining a third frequency offset average over a second half of the syncword; and
   means for determining an effective frequency offset at an end of the syncword based on the first frequency offset average, the second frequency offset average and the third frequency offset average.

26. The apparatus of claim 25, wherein the effective frequency offset is equal to the second frequency offset average plus the third frequency offset average minus the first frequency offset average.

27. The apparatus of claim 25, wherein the means for determining the first frequency offset average over the first half of the syncword comprises means for averaging instantaneous frequency offsets over the first half of the syncword.

28. The apparatus of claim 25, wherein the means for determining the second frequency offset average over the entire syncword comprises means for averaging instantaneous frequency offsets over the entire syncword.

29. The apparatus of claim 25, wherein the means for determining the third frequency offset average over the second half of the syncword comprises means for averaging instantaneous frequency offsets over the second half of the syncword.

30. The apparatus of claim 25, further comprising means for providing the effective frequency offset to an electronic device.

31. The apparatus of claim 25, wherein the apparatus is an acquisition block.

32. The apparatus of claim 25, wherein the effective frequency offset comprises a constant frequency offset component and a linearly varying frequency drift component.

* * * * *